US007073159B2

(12) United States Patent
Tsai et al.

(10) Patent No.: US 7,073,159 B2
(45) Date of Patent: Jul. 4, 2006

(54) CONSTRAINTS-DIRECTED COMPILATION FOR HETEROGENEOUS RECONFIGURABLE ARCHITECTURES

(75) Inventors: Vicki W. Tsai, Mountain View, CA (US); Hooman Honary, Newport Coast, CA (US); Ernest T. Tsui, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 10/814,568

(22) Filed: Mar. 31, 2004

(65) Prior Publication Data
US 2005/0229140 A1    Oct. 13, 2005

(51) Int. Cl.
*G06F 17/50*    (2006.01)
(52) U.S. Cl. .............................. 716/17; 716/16; 716/5
(58) Field of Classification Search .................... 716/5, 716/16–17
See application file for complete search history.

(56) References Cited

U.S. PATENT DOCUMENTS

| | | | | |
|---|---|---|---|---|
| 5,128,871 | A * | 7/1992 | Schmitz ........................ | 716/17 |
| 6,038,386 | A * | 3/2000 | Jain ............................ | 716/16 |
| 6,112,023 | A * | 8/2000 | Dave et al. ................... | 703/27 |
| 6,195,788 | B1 * | 2/2001 | Leaver et al. ................. | 716/18 |
| 6,298,319 | B1 * | 10/2001 | Heile et al. ................... | 703/26 |
| 6,941,538 | B1 * | 9/2005 | Hwang et al. ................. | 716/16 |
| 2004/0194048 | A1 * | 9/2004 | Arnold ........................ | 716/17 |
| 2005/0149890 | A1 | 7/2005 | Tsai et al. | |
| 2005/0193357 | A1 * | 9/2005 | Honary et al. ................ | 716/17 |
| 2005/0223110 | A1 | 10/2005 | Honary et al. | |
| 2005/0229139 | A1 * | 10/2005 | Tsai et al. ..................... | 716/17 |

FOREIGN PATENT DOCUMENTS

| WO | WO-0038087 A1 | 6/2000 |
|---|---|---|
| WO | WO-05098649 A2 | 10/2005 |
| WO | WO-05098649 A3 | 10/2005 |

OTHER PUBLICATIONS

*International Search Report and Written Opinion of the International Searching Authority*: Dated Oct. 7, 2005; PCT/US2005/010135, (14 pgs).
Ahmadinia, A., et al., "Temporal Task Clustering for Online Placement on Reconfigurable Hardware", *Field-Programmable Technology (FPT), 2003. Proceedings IEEE International Conference*, XP010688364,(Dec. 15, 2003),359-362.
Blume, H., et al., "Model-based Exploration of the Design Space for Heterogeneous System on Chip", *Proceedings of the IEEE International Conference on Application-Specific Systems, Architectures and Processors, 2002.*, XP010601457,(Jul. 17, 2002),29-40.
Parameswaram, S., et al., "Profiling in the ASP Codesign Environment", *Journal of Systems Architcture, Elsevier Science Publishers BV*, 46(14), XP004224625,(Dec. 1, 2000),1263-1274.
Sciuto, D., et al., "Metrics for Design Space Exploration of Heterogeneous Multiprocesssor embedded Systems", *Proceedings of the 10th International Workshop on Hardware/Software Codesign*, XP002317354,(May 6, 2002),55-60.

* cited by examiner

*Primary Examiner*—Stacy A Whitmore
(74) *Attorney, Agent, or Firm*—LeMoine Patent Services, PLLC

(57) ABSTRACT

Compilation of a design description for a heterogeneous reconfigurable architecture is influenced by user-specified constraints.

28 Claims, 4 Drawing Sheets

CONSTRAINTS-DIRECTED COMPILATION FOR HETEROGENEOUS RECONFIGURABLE ARCHITECTURES

FIELD

The present invention relates generally to reconfigurable circuits, and more specifically to programming/configuring reconfigurable circuits.

BACKGROUND

Some integrated circuits are programmable or configurable. Examples include microprocessors and field programmable gate arrays. As programmable and configurable integrated circuits become more complex, the tasks of programming and configuring them also become more complex.

DESCRIPTION OF EMBODIMENTS

Figure 1:
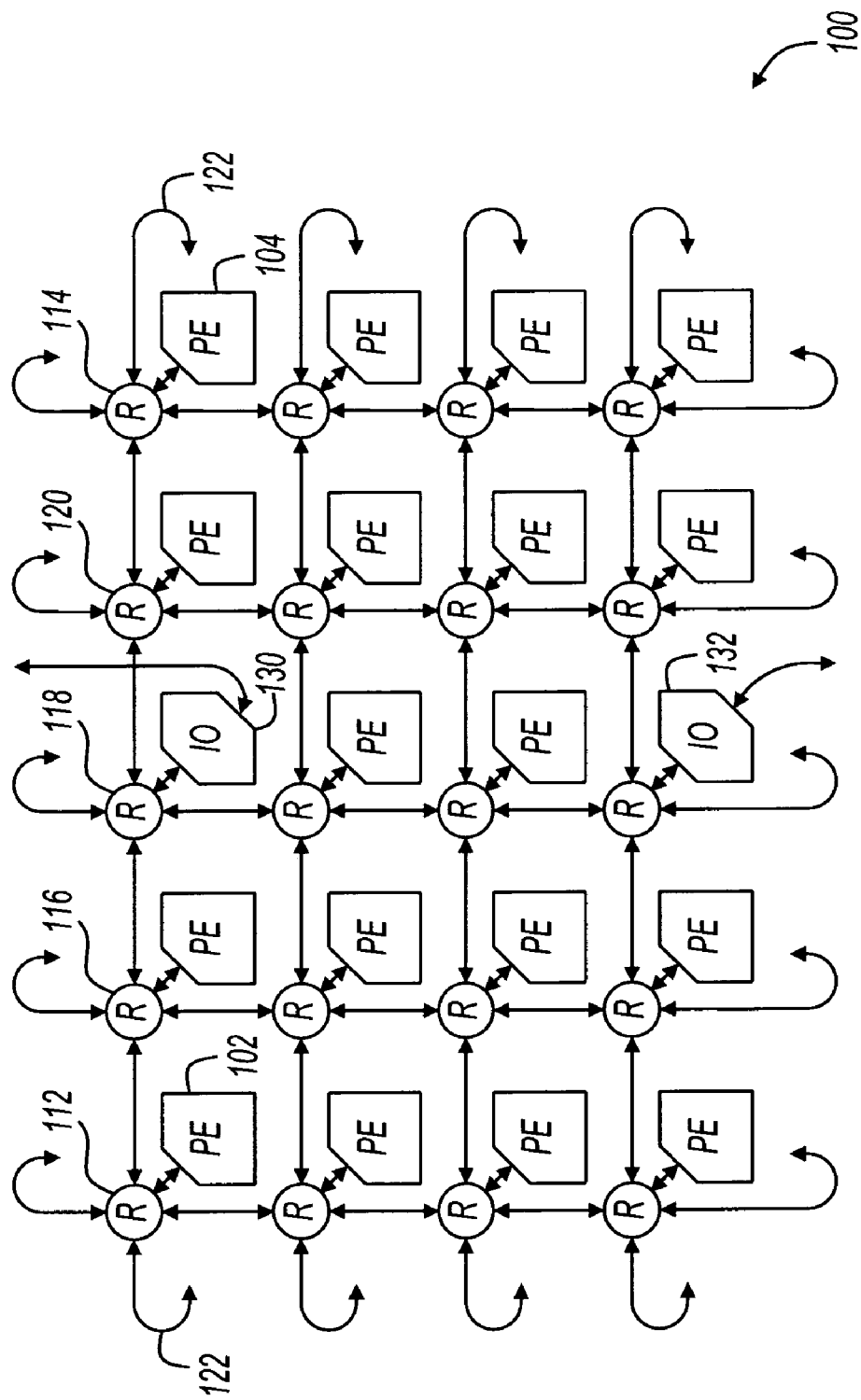
FIG. 1 shows a block diagram of a reconfigurable circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a block diagram of a reconfigurable circuit. Reconfigurable circuit 100 includes a plurality of processing elements (PEs) and a plurality of interconnected routers (Rs). In some embodiments, each PE is coupled to a single router, and the routers are coupled together. For example, as shown in FIG. 1, PE 102 is coupled to router 112, and PE 104 is coupled to router 114. Also for example, as shown in FIG. 1, routers 112 and 114 are coupled together through routers 116, 118, and 120, and are also coupled together directly by interconnect 122 (shown at left of R 112 and at right of R 114). The various routers (and PEs) in reconfigurable circuit 100 are arranged in rows and columns with nearest-neighbor interconnects, forming a toroidal interconnect. In some embodiments, each router is coupled to a single PE; and in other embodiments, each router is coupled to more than one PE.

Configurable circuit 100 may include various types of PEs having a variety of different architectures. For example, PE 102 may include a programmable logic array that may be configured to perform a particular logic function, while PE 104 may include a processor core that may be programmed with machine instructions. In general, any number of PEs with a wide variety of architectures may be included within configurable circuit 100. In embodiments that utilize various different architectures for PEs, configurable circuit 100 may be referred to as a "heterogeneous reconfigurable architecture."

As shown in FIG. 1, configurable circuit 100 also includes input/output (IO) nodes 130 and 132. Input/output nodes 130 and 132 may be used by configurable circuit 100 to communicate with other circuits. For example, IO node 130 may be used to communicate with a host processor, and IO node 132 may be used to communicate with an analog front end such as a radio frequency (RF) receiver or transmitter. Any number of IO nodes may be included in configurable circuit 100, and their architectures may vary widely. Like PEs, IO nodes may be configurable, and may have differing levels of configurability based on their underlying architectures.

In some embodiments, each PE is individually configurable. For example, PE 102 may be configured by loading a table of values that defines a logic function, and PE 104 may be programmed by loading a machine program to be executed by PE 104. In some embodiments, a PE may be configured or programmed to perform multiple functions. For example, a PE may perform multiple filtering functions or multiple coding or decoding functions. In some embodiments, multiple functions may operate in parallel in a PE.

In some embodiments, the routers communicate with each other and with PEs using packets of information. For example, if PE 102 has information to be sent to PE 104, it may send a packet of data to router 112, which routes the packet to router 114 for delivery to PE 104. Packets may be of any size. In embodiments that utilize packets, configurable circuit 100 may be referred to as a "packet-based heterogeneous reconfigurable architecture."

Programmable elements and IO nodes are examples of heterogeneous resources within a configurable circuit. In general, configurable circuits may include any number of different types of configurable or programmable resources. The various number and types of resources within a configurable circuit may be programmed with configuration information generated, at least in part, by a compiler or other automated process. Examples of methods and processes for generating configuration information are discussed further below.

Configurable circuit 100 may be configured by receiving configuration packets through an IO node. For example, IO node 130 may receive configuration packets that include configuration information for various PEs and IO nodes, and the configuration packets may be routed to the appropriate nodes. Configurable circuit 100 may also be configured by receiving configuration information through a dedicated programming interface. For example, a serial interface such as a serial scan chain may be utilized to program configurable circuit 100.

Configurable circuit 100 may have many uses. For example, configurable circuit 100 may be configured to instantiate particular physical layer (PHY) implementations in communications systems, or to instantiate particular media access control layer (MAC) implementations in communications systems. In some embodiments, multiple configurations for configurable circuit 100 may exist, and changing from one configuration to another may allow a communications system to quickly switch from one PHY to another, one MAC to another, or between any combination of multiple configurations. Also for example, configurable circuit 100 may be configured for use in image processing applications, or other applications. In general, heterogeneous reconfigurable architectures may be configured for any useful purpose.

In some embodiments, configurable circuit 100 is part of an integrated circuit. In some of these embodiments, configurable circuit 100 is included on an integrated circuit die that includes circuitry other than configurable circuit 100. For example, configurable circuit 100 may be included on an integrated circuit die with a processor, memory, or any other suitable circuit. In some embodiments, configurable circuit 100 coexists with radio frequency (RF) circuits on the same integrated circuit die to increase the level of integration of a communications device. Further, in some embodiments, configurable circuit 100 spans multiple integrated circuit dies.

Figure 2:
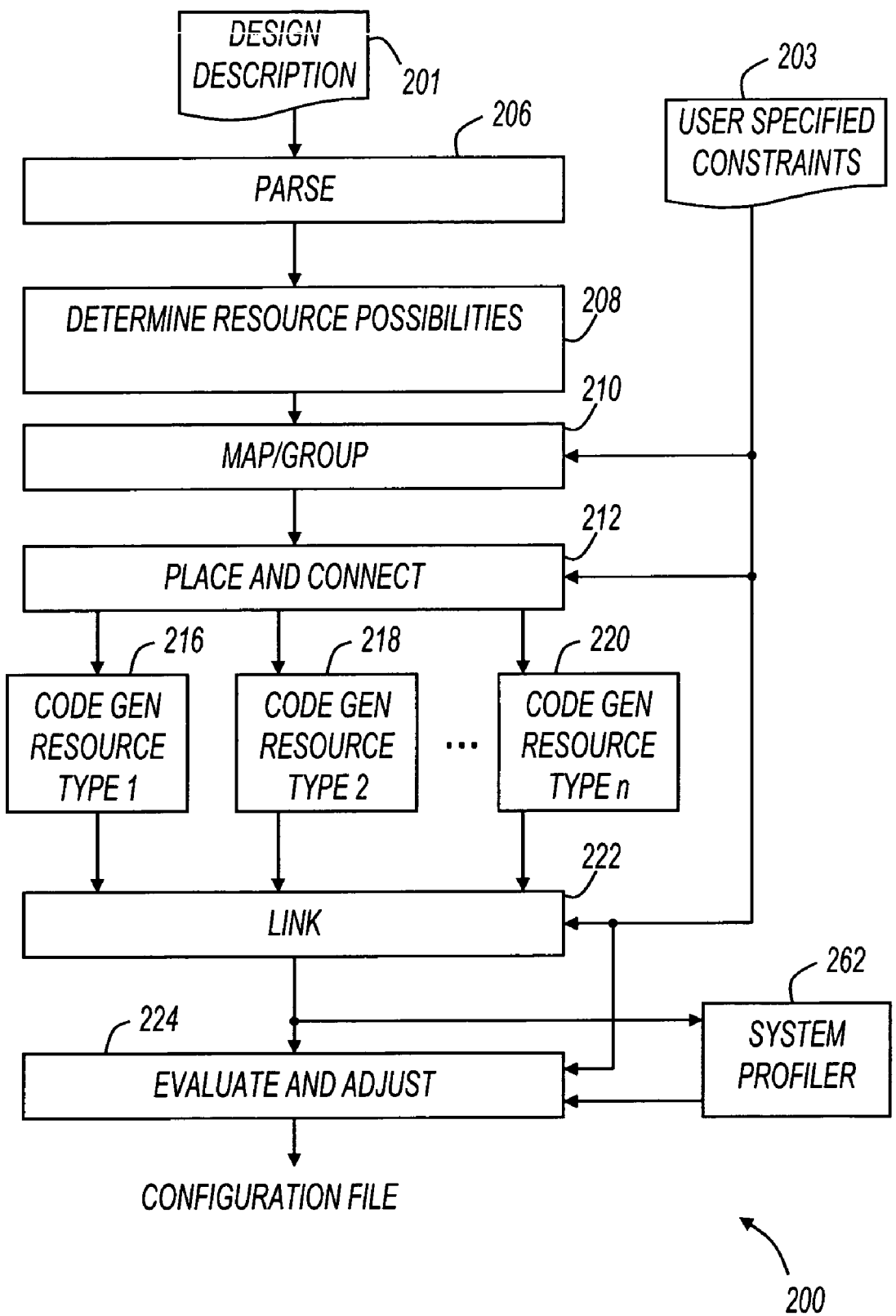
FIG. 2 shows a diagram of a heterogeneous reconfigurable architecture design flow.

FIG. 2 shows a diagram of a heterogeneous reconfigurable architecture design flow. In some embodiments, all or a portion of design flow 200 is implemented by a compiler that can automatically map onto and compile code and/or generate configurations for a heterogeneous reconfigurable architecture to satisfy user-specified constraints such as processing latency, power consumption, and area used. Since the target architecture is heterogeneous, implementing certain pieces of code or functionality on one set of resources may result in different characteristics (e.g. latency, power, area) than when the same code or functionality is implemented on another set of resources. As described further below, design flow 200 may use prioritized user-specified constraints to weigh trade-offs to produce a satisfactory mapping between the design description and the resources in a target heterogeneous architecture.

As used herein, the terms "compiler," "compilation," and the like refer to tools useful for generating machine code or for generating configuration information. For example, a compiler may generate machine code for some resources within a heterogeneous reconfigurable architecture, and may generate configuration information for other resources within the same heterogeneous reconfigurable architecture.

Design flow 200 represents various embodiments of design flows to process a design description and create a configuration for a heterogeneous reconfigurable architecture. The various actions represented by the blocks in design flow 200 may be performed in the order presented, or may be performed in a different order. Further, in some embodiments, some blocks shown in FIG. 2 are omitted from design flow 200. As shown in FIG. 2, design flow 200 may accept design description 201 and user-specified constraints 203. In some embodiments, design flow 200 may also accept a hardware topology specification that includes information describing the number, arrangement, and types of resources in a target heterogeneous reconfigurable architecture.

Design description 201 includes information describing the operation of the intended design. The intended design may be useful for any purpose. For example, the intended design may be useful for image processing, video processing, audio processing, or the like. The intended design is referred to herein as a "configuration," but this terminology is not meant to limit the invention in any way. In some embodiments, the configuration specified by design description 201 may be in the form of an algorithm that a particular PHY, MAC, or combination thereof, is to implement. The design description may be in the form of a procedural or object-oriented language, such as C, C++, or hardware design language (HDL), or may be written in a specialized, or "stylized" version of a high level language.

User-specified constraints 203 may include constraints such as minimum requirements that the completed configuration should meet, or may include other information to constrain the operation of the design flow. For example, user-specified constraints 203 may be related to power consumption, area usage, latency, throughput, or other parameter. In some embodiments, various constraints are assigned weights so that they are given varying levels of priority during the operation of design flow 200. Also in some embodiments, various constraints may be prioritized.

In some embodiments, constraints may be listed as requirements or preferences, and in some embodiments, constraints may be listed as ranges of parameter values. In some embodiments, constraints may not be absolute. For example, if the target reconfigurable architecture includes a data path that communicates with packets, the measured latency through part of the protocol may not be a fixed value but instead may be one with a statistical variation.

User-specified constraints 203 may be utilized at various phases of design flow 200 to affect operation of the design flow. For example, the manner in which functions may be assigned or re-assigned to resources within a reconfigurable architecture may be based on constraints. Further, user-specified constraints may be utilized heuristically early in design flow 200, or may be used more deterministically later in design flow 200. Examples of these uses of constraints, as well as examples of other uses, are described below.

In design flow 200, design description 201 is parsed at 206. Parsing may include partitioning into functions or subsystems of functions. For example, partitioning may include breaking a design description into non-overlapping segments in time (i.e., "modes") where different processing may occur. Also for example, partitioning may include breaking design description 201 into blocks that serve control functions, data path functions, or both. In some embodiments, a design description may be partitioned into a hierarchical representation of modes and functions. The manner in which design description 201 is partitioned is not a limitation of the present invention. Further, the terminology (such as "functions" or "subsystems of functions") used to describe portions of a design flow are not meant to be limiting.

At 208 and 210, functions are mapped to resources. In some embodiments, functions are grouped by selecting various functions that can execute on the same resource type. All functions are assigned to a group, and each group may include any number of functions. Each group may be assigned to a single resource in a heterogeneous reconfigurable architecture, or groups may be combined prior to assigning them to resources.

In some embodiments, prior to forming groups, all possible resource mappings are enumerated for each function at 208. A hardware topology specification (not shown) may be utilized to determine the types of resources available in the target reconfigurable architecture. The code in each function may then be analyzed to determine the possible resource types on which the function could successfully map. Some functions may have only one possibility, such as a library function with a single implementation. Library information may be supplied by function libraries (not shown) available to design flow 200. Other functions may have many possibilities, such as a simple arithmetic function which may be implemented on many different types of resources. A table may be built that contains all the possibilities of each function, which may be ranked in order of likelihood. This table may be referenced throughout design flow 200.

After the table has been constructed, groups functions may be formed at 210. Mapping uses the table constructed at 208 to determine what groupings are possible. Functions that can execute on only one type of resource may be limited with respect to the groups to which they can belong. In some embodiments, user-specified constraints 203 may specify a grouping of functions, or may specify a maximum delay or latency that may affect the successful formation of groups.

At this point in design flow 200, heuristics based on the user-specified high-level constraints may be used to guide the grouping procedure. For example, if reducing latency was the only priority, design flow 200 could choose to map as many functions as possible to resources with hardware accelerators. To compile with reduced power as the highest priority, design flow 200 can use a pre-determined database that estimates the power for each instruction or configuration, depending on the individual resource's architecture. To compile for low area, design flow 200 can use a hardware description of the architecture that specifies the area for each resource. A more challenging task is presented when the user specifies a combination of these parameters. Here, various embodiments of the invention may weigh the trade-offs in choosing one resource over another or a specific grouping over another.

At 212 in design flow 200, the groups are assigned, or "placed," to particular resources in the target reconfigurable architecture. Operations corresponding to block 212 choose the placement in the architecture that a group should occupy and then adds the connection information that ensure proper data flow between the original functions. Several factors may guide the placement, including group placement possibilities, user constraints, and the profiler-based feedback (described more fully below). For example, to satisfy tight latency constraints, it may be useful to place two groups on resources that are next to each other. The placement may also be guided by the directed feedback from the "evaluate and adjust" operation described below.

At 216, 218, and 220 of design flow 200, code and/or configuration information is generated for various types of resources in the target reconfigurable architecture. In some embodiments, different code generation tools exist for different types of resources. For example, a resource such as a programmable element (PE) that includes programmable logic may have code or a configuration generated by a translator that translates the intermediate representation of logic equations into tables of information to configure the PE. Also for example, a PE that includes a processor or controller may have code generated by an assembler or compiler. In some embodiments, code is generated for each function, and then the code for a group of functions is generated for a resource. In other embodiments, code for a resource is generated from a group of functions in one operation. In some embodiments, configuration packets are generated to program the various resources. Configuration packets may include the data to configure a particular resource, and may also include the address of the resource to be configured. For example, in some embodiments, the address of a PE is specified as a relative address from the IO node that is used to communicate with the host.

At 222, binary information from previous blocks in design flow 200 is ordered and formed into the appropriate format to be run by the target architecture's system profiler 262. System profiler 262 may measure the quality of the current configuration as specified by the output of block 222. In some embodiments, system profiler 262 allows the gathering of information that may be compared against the user-specified constraints to determine the quality of the current configuration. For example, the system profiler 262 may be utilized to determine whether the user-specified latency or throughput requirements can be met given the current grouping, mapping, and placement.

System profiler 262 may be a software program that emulates a reconfigurable architecture, or may be a hardware device that accelerates profiling. In some embodiments, system profiler 262 includes a configurable circuit having an architecture the same as that of the target reconfigurable architecture. In other embodiments, system profiler 262 includes a configurable circuit having an architecture that is similar to the target reconfigurable architecture. System profiler 262 may accept configuration information from block 222 through any kind of interface, including any type of serial or parallel interface.

The system profiler passes the data regarding latency, throughput, and other performance results to the "evaluate and adjust" block at 224. If the mapping and placement are unsatisfactory, block 224 may evaluate a cost function that includes inputs from system profiler 262 and user-specified constraints 203. Based on the cost function, block 224 may choose to adjust the current grouping, mapping, resources used, placement of the groups onto the architecture, or any other parameter. After the adjustments are made, design flow 200 may iterate through the previous blocks until it is done with its adjustments. The output of 224 may be a configuration file that may be used to configure the reconfigurable architecture.

A completed configuration is output from 224 when the constraints are met. In some embodiments, the completed configuration is in the form of a file that specifies the configuration of a heterogeneous reconfigurable architecture such as configurable circuit 100 (FIG. 1). In some embodiments, the completed configuration is in the form of configuration packets to be loaded into a configurable circuit such as configurable circuit 100. The form taken by the completed configuration is not a limitation of the present invention.

The design flow described above with reference to FIG. 2 may be implemented in whole or in part by a computer or other electronic system. For example, in some embodiments, all of design flow 200 may be implemented within a compiler to compile configurations for heterogeneous reconfigurable architectures. In other embodiments, portions of design flow 200 may be implemented in a compiler, and portions of design flow 200 may be performed by a user. For example, in some embodiments, a user may perform partitioning of the design description functions or blocks of functions.

Figure 3:
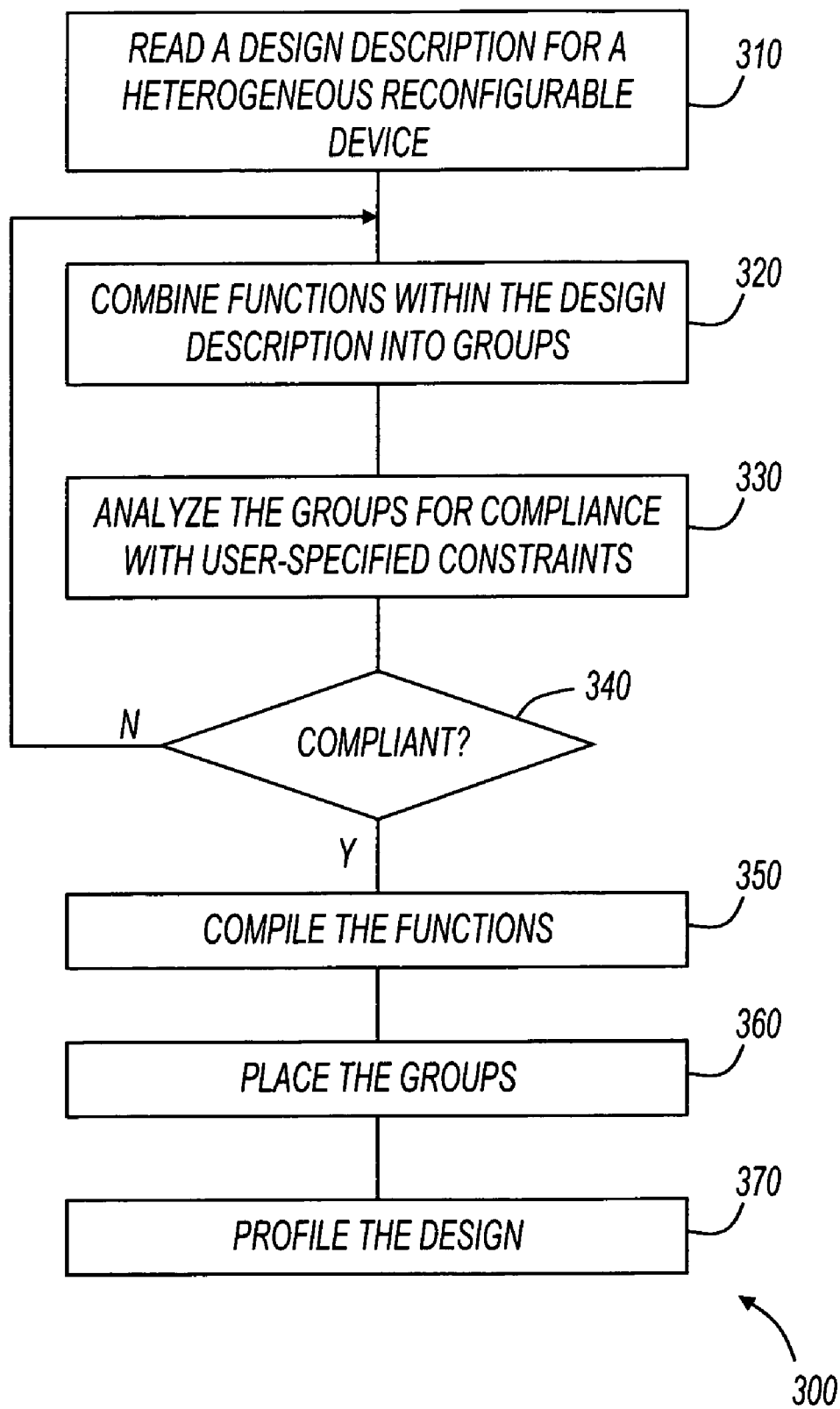
FIG. 3 shows a flowchart in accordance with various embodiments of the present invention.

FIG. 3 shows a flowchart in accordance with various embodiments of the present invention. In some embodiments, method 300, or portions thereof, is performed by an electronic system, or an electronic system in conjunction with a person's actions. In other embodiments, all or a portion of method 300 is performed by a control circuit or processor, embodiments of which are shown in the various figures. Method 300 is not limited by the particular type of apparatus, software element, or person performing the method. In some embodiments, method 300 may be performed by a compiler when generating a configuration for a heterogeneous reconfigurable architecture. The various actions in method 300 may be performed in the order presented, or may be performed in a different order. Further, in some embodiments, some actions listed in FIG. 3 are omitted from method 300.

Method 300 is shown beginning with block 310 where a design description for a heterogeneous reconfigurable device is read. In some embodiments, block 310 corresponds to a processor or compiler reading design description 201 (FIG. 2). At 320, functions within the design description are combined into groups. The combination into groups may be guided, at least in part, by heuristics based on user-specified constraints. For example, if reducing latency is the highest priority in the user-specified constraints, functions may be combined into groups with reduced latency as a primary goal. Also for example, if reducing power is the highest priority in the user-specified constraints, heuristic information describing power consumption of particular types of functions and various resources may be consulted.

At 330, the groups are analyzed for compliance with user-specified constraints. Here, various parameter estimations may be made based on groupings and mapping of functions within the target heterogeneous reconfigurable architecture. For example, power consumption may be estimated, latency may be estimated, or area usage may be estimated. Further, in some embodiments, estimating latency may include estimating processing latency as well as interconnect latency. If at 340, the estimated parameter values are not compliant with the user-specified constraints, mapping and grouping may be repeated. This process may be repeated any number of times in attempts to meet the user-specified constraints. The iteration may cease if the estimated parameters are within a specified range of the target constraints values, in order to complete the design and perform more analysis.

At 350, functions are compiled into machine code or configurations to run on resources within the heterogeneous reconfigurable architecture. For example, referring now to FIG. 2, one of code generators 216, 218, or 220 may compile statements into machine code or a configuration to run on a resource. The operation represented by 350 includes any kind of translation or compilation that produces configuration information for a resource within a heterogeneous reconfigurable architecture.

At 360, the groups are placed. Placement includes determining which resources will implement the groups generated at 320. For example, referring back to FIG. 1, various PEs may be identified for implementing specific groups of functions. Here, trade-offs are weighed in choosing one resource over another or a specific grouping over another. The actions of 360 may be driven, at least in part, by heuristics.

At 370, the design is profiled. The design referred to in 370 includes the configuration information for the various resources in a heterogeneous reconfigurable architecture. For example, referring now back to FIG. 2, the output of block 222 may represent the design to be profiled. Profiling may be accomplished using one or more of many different methods. For example, a system profiler running in software may profile the design. Also for example, the target system including a configurable circuit may be employed to profile the design. The type of hardware or software used to profile the design is not a limitation of the present invention. All or a portion of method 300 may be repeated based on the outcome of profiling. For example, functions may be grouped and placed differently based on the outcome of the profiling.

Figure 4:
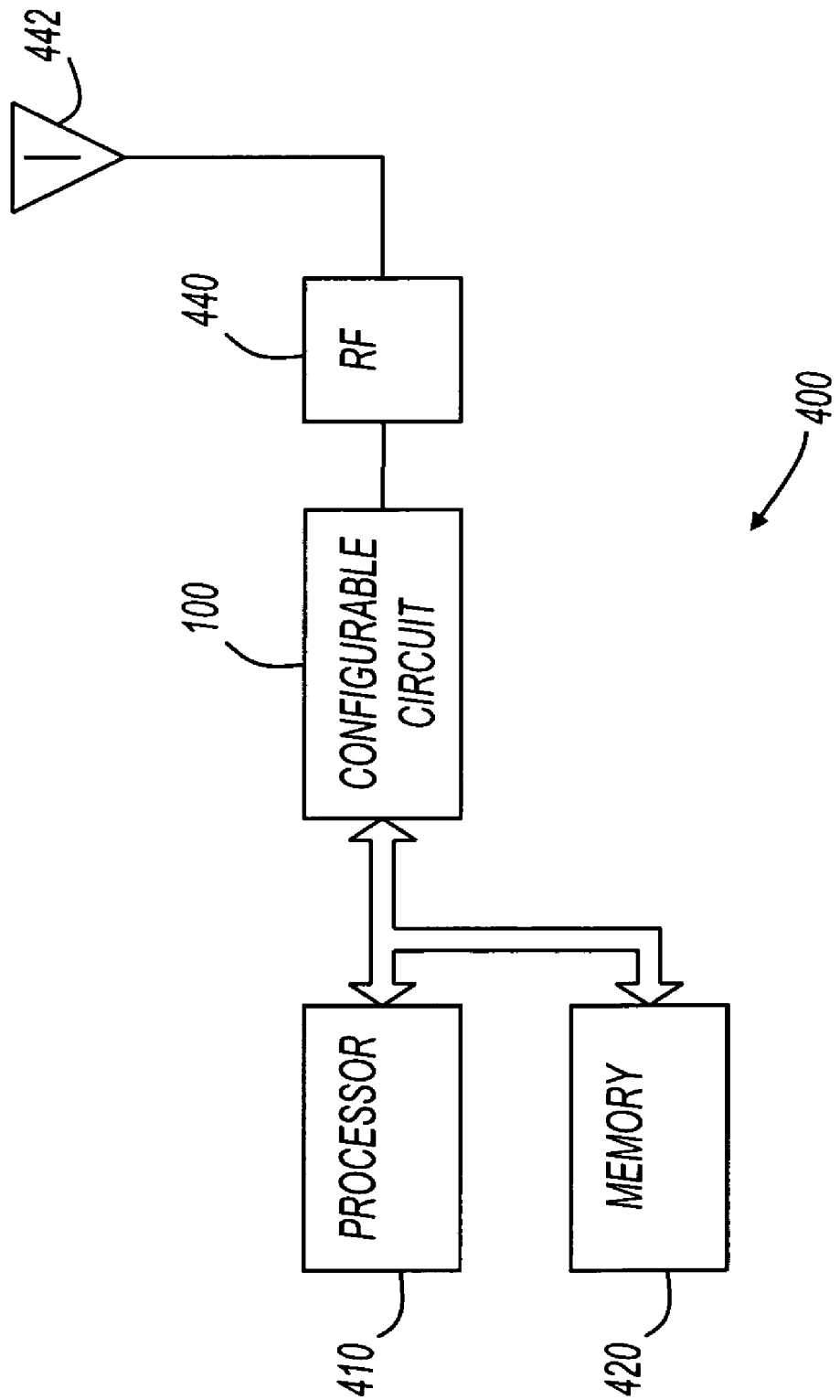
FIG. 4 shows a diagram of an electronic system in accordance with various embodiments of the present invention.

FIG. 4 shows a block diagram of an electronic system. System 400 includes processor 410, memory 420, configurable circuit 100, RF interface 440, and antenna 442. In some embodiments, system 400 may be a computer system to develop configurations for use in configurable circuit 100. For example, system 400 may be a personal computer, a workstation, a dedicated development station, or any other computing device capable of creating a protocol for configurable circuit 100. In other embodiments, system 400 may be an "end-use" system that utilizes configurable circuit 100 after it has been programmed to implement a particular configuration. Further, in some embodiments, system 400 may be a system capable of developing protocols as well as using them.

In some embodiments, processor 410 may be a processor that can perform methods implementing all of design flow 200, or portions of design flow 200. For example, processor 410 may perform function grouping, placement, mapping, profiling, or any combination thereof. Processor 410 represents any type of processor, including but not limited to, a microprocessor, a microcontroller, a digital signal processor, a personal computer, a workstation, or the like.

In some embodiments, system 400 may be a communications system, and processor 410 may be a computing device that performs various tasks within the communications system. For example, system 400 may be a system that provides wireless networking capabilities to a computer. In these embodiments, processor 410 may implement all or a portion of a device driver, or may implement a lower level MAC. Also in these embodiments, configurable circuit 100 may implement one or more protocols for wireless network connectivity. In some embodiments, configurable circuit 100 may implement multiple protocols simultaneously, and in other embodiments, processor 410 may change the protocol in use by reconfiguring configurable circuit 100.

Memory 420 represents an article that includes a machine readable medium. For example, memory 420 represents any one or more of the following: a hard disk, a floppy disk, random access memory (RAM), dynamic random access memory (DRAM), static random access memory (SRAM), read only memory (ROM), flash memory, CDROM, or any other type of article that includes a medium readable by a machine such as processor 410. In some embodiments, memory 420 can store instructions for performing the execution of the various method embodiments of the present invention.

In operation of some embodiments, processor 410 reads instructions and data from memory 420 and performs actions in response thereto. For example, various method embodiments of the present invention may be performed by processor 410 while reading instructions from memory 420.

Antenna 442 may be either a directional antenna or an omni-directional antenna. For example, in some embodiments, antenna 442 may be an omni-directional antenna such as a dipole antenna, or a quarter-wave antenna. Also for example, in some embodiments, antenna 442 may be a directional antenna such as a parabolic dish antenna or a Yagi antenna. In some embodiments, antenna 442 is omitted.

In some embodiments, RF signals transmitted or received by antenna 442 may correspond to voice signals, data signals, or any combination thereof. For example, in some embodiments, configurable circuit 100 may implement a protocol for a wireless local area network interface, cellular phone interface, global positioning system (GPS) interface, or the like. In these various embodiments, RF interface 440 may operate at the appropriate frequency for the protocol implemented by configurable circuit 100. In some embodiments, RF interface 440 is omitted.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A method comprising:
   reading a design description for a heterogeneous reconfigurable device that includes a plurality of programmable elements with different underlying architectures, wherein a first type of the plurality of programmable elements is capable of executing instructions, and a second type of the plurality of programmable elements is capable of different configurations to implement logic, the design description including a plurality of functions to map to the plurality of programmable elements;
   combining the plurality of functions within the design description into groups based at least in part on possible programmable element types upon which the plurality of functions could successfully map;
   estimating power consumption of the groups using a pre-determined database that estimates the power for each instruction or configuration, depending on the underlying architecture of a target programmable element type for each group; and
   analyzing the groups for compliance with user-specified constraints, wherein the user-specified constraints include power consumption constraints.

2. The method of claim 1 further comprising estimating area occupied by the groups.

3. The method of claim 1 further comprising re-combining the plurality of functions into groups, re-estimating power consumption, and re-analyzing the groups for compliance with the user-specified constraints.

4. The method of claim 1 wherein analyzing comprises comparing estimated parameters with prioritized user-specified constraints.

5. The method of claim 1 further comprising compiling the functions to run on processing elements within the heterogeneous reconfigurable device.

6. The method of claim 5 further comprising placement of the groups onto particular processing elements within the heterogeneous reconfigurable device.

7. The method of claim 6 further comprising analyzing the placement for compliance with user-specified constraints.

8. The method of claim 7 further comprising estimating latency.

9. The method of claim 8 wherein estimating latency comprises estimating interconnect delay.

10. The method of claim 8 wherein estimating latency comprises estimating processing latency.

11. The method of claim 8 wherein estimating latency further comprises estimating processing latency and interconnect latency.

12. The method of claim 6 further comprising producing a file with a placed design for profiling.

13. The method of claim 12 further comprising profiling the design and comparing with user-specified constraints.

14. The method of claim 13 further comprising re-grouping the plurality of functions in response to the profiling.

15. The method of claim 13 further comprising re-performing placement in response to the profiling.

16. A method comprising:
   mapping a plurality of functions into groups;
   placing the groups on resources within a heterogeneous reconfigurable device; the resources including a plurality of prourammable elements with different underlying architectures, wherein a first type of the plurality of programmable elements is capable of executing instructions, and a second type of the plurality of programmable elements is capable of different configurations to implement logic;
   estimating power consumption of the groups using a pre-determined database that estimates the power for each instruction or configuration, depending on the underlying architecture of a target programmable element type for each group;

analyzing the groups for compliance with user-specified constraints, wherein the user-specified constraints include power consumption constraints;

producing a mapped and placed design representation;

profiling the design representation; and comparing results from the profiling with the user-specified constraints.

17. The method of claim 16 further comprising re-mapping the plurality of functions into groups.

18. The method of claim 16 further comprising re-placing the groups on resources.

19. The method of claim 16 wherein comparing results comprises comparing an estimated latency with a latency specified in the user-specified constraints.

20. The method of claim 19 wherein the estimated latency includes processing latency and interconnect latency.

21. The method of claim 16 wherein the user-specified constraints include latency, power, and throughput.

22. An apparatus including a medium to hold machine-accessible instructions that when accessed result in a machine performing:

reading a design description for a heterogeneous reconfigurable device that includes a plurality of programmable elements with different underlying architectures, wherein a first type of the plurality of programmable elements is capable of executing instructions, and a second type of the plurality of programmable elements is capable of different confi2urations to implement logic, the design description including a plurality of functions to map to the plurality of programmable elements;

combining the plurality of functions within the design description into groups based at least in part on possible programmable element types upon which the plurality of functions could successfully map;

estimating power consumption of the groups using a pre-determined database that estimates the power for each instruction or configuration. depending on the underlying architecture of a target programmable element type for each group; and analyzing the groups for compliance with user-specified constraints, wherein the user-specified constraints include power consumption constraints.

23. The apparatus of claim 22 wherein the machine-accessible instructions when accessed further result in the machine performing:

re-combining the plurality of functions into groups; and re-analyzing the groups for compliance with the user-specified constraints.

24. The apparatus of claim 22 wherein the machine-accessible instructions when accessed further result in the machine performing:

compiling the functions to run on processing elements within the heterogeneous reconfigurable device.

25. The apparatus of claim 22 wherein analyzing comprises comparing estimated parameters with prioritized user-specified constraints.

26. An electronic system comprising:

a processor; and a static random access memory to hold instructions that when accessed result in the processor performing reading a design description for a heterogeneous reconfigurable device that includes a plurality of programmable elements with different underlying architectures, wherein a first type of the plurality of programmable elements is capable of executing instructions, and a second type of the plurality of programmable elements is capable of different configurations to implement logic, the design description including a plurality of functions to map to the plurality of programmable elements; combining the plurality of functions within the design description into groups based at least in part on possible programmable element types upon which the plurality of functions could successfully map; estimating power consumption of the groups using a pre-determined database that estimates the power for each instruction or configuration, depending on the underlying architecture of a target programmable element type for each group; and analyzing the groups for compliance with user-specified constraints wherein the user-specified constraints include power consumption constraints.

27. The electronic system of claim 26 wherein the instructions when accessed further result in the processor performing re-combining the plurality of functions into groups, and re-analyzing the groups for compliance with the user-specified constraints.

28. The electronic system of claim 27 wherein analyzing comprises comparing estimated parameters with prioritized user-specified constraints.

* * * * *

UNITED STATES PATENT AND TRADEMARK OFFICE
CERTIFICATE OF CORRECTION

PATENT NO.       : 7,073,159 B2
APPLICATION NO.  : 10/814568
DATED            : July 4, 2006
INVENTOR(S)      : Tsai et al.

It is certified that error appears in the above-identified patent and that said Letters Patent is hereby corrected as shown below:

On the title page, (56), under "Other Publications", in column 2, line 2, delete "Authority:" and insert --Authority;--, therefor.

On the title page, (56), under "Other Publications", in column 2, line 18, delete "Multiprocesssor" and insert -- Multiprocessor--, therefor.

In column 10, line 57, in Claim 16, delete "prourammable" and insert -- programmable --, therefor.

In column 11, line 28, Claim 22, delete "confi2urations" and insert -- configurations --, therefor.

In column 11, line 38, Claim 22, delete "configuration." and insert -- configuration, --, therefor.

Signed and Sealed this

Twenty-sixth Day of September, 2006

JON W. DUDAS
*Director of the United States Patent and Trademark Office*